United States Patent
Wong et al.

(10) Patent No.: US 11,626,284 B2
(45) Date of Patent: Apr. 11, 2023

(54) METHOD OF FORMING A 2-DIMENSIONAL CHANNEL MATERIAL, USING ION IMPLANTATION

(71) Applicant: Applied Materials, Inc., Santa Clara, CA (US)

(72) Inventors: Keith T. Wong, Mountain View, CA (US); Hurshvardhan Srivastava, Santa Clara, CA (US); Srinivas D. Nemani, Saratoga, CA (US); Johannes M. van Meer, Middleton, MA (US); Rajesh Prasad, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 17/150,781

(22) Filed: Jan. 15, 2021

(65) Prior Publication Data
US 2022/0108886 A1   Apr. 7, 2022

Related U.S. Application Data

(60) Provisional application No. 63/086,774, filed on Oct. 2, 2020.

(51) Int. Cl.
*H01L 21/02* (2006.01)
*H01L 29/66* (2006.01)
(Continued)

(52) U.S. Cl.
CPC ........ *H01L 21/02573* (2013.01); *C23C 14/48* (2013.01); *C23C 14/5806* (2013.01);
(Continued)

(58) Field of Classification Search
CPC .......... H01L 21/0257; H01L 21/02592; H01L 21/02667; H01L 12/1206; H01L 12/1213;
(Continued)

(56) References Cited

U.S. PATENT DOCUMENTS 9,863,039 B2 * 1/2018 Min ........................ C23C 16/44
2015/0211112 A1 * 7/2015 Cadot ............... C23C 16/45555
427/255.31
(Continued)

FOREIGN PATENT DOCUMENTS

WO   WO-2019077156 A1 *  4/2019  ......... C23C 14/0623

OTHER PUBLICATIONS

S Balabanov, T Tsvetkova, K Nanev, E Skordeva, Ts Marinova, V Krastev, B Amov, Ch Angelov, Formation of carbon aggregates in ion-implanted amorphous AsSe, Journal of Non-Crystalline Solids, vols. 192-193, (1995).*
(Continued)

*Primary Examiner* — Yara B Green
*Assistant Examiner* — Fakeha Sehar
(74) *Attorney, Agent, or Firm* — KDB Firm PLLC

(57) ABSTRACT

A method to form a 2-Dimensional transistor channel may include depositing an amorphous layer comprising a 2-dimensional material, implanting an implant species into the amorphous layer; and annealing the amorphous layer after the implanting. As such, the amorphous layer may form a doped crystalline layer.

20 Claims, 4 Drawing Sheets

DEPOSIT ULTRATHIN FILM OF AMORPHOUS 2-D MATERIAL ON SUBSTRATE BY ATOMIC LAYER DEPOSITION INCLUDING CARBON-CONTAINING PRECURSOR
102

↓

INTRODUCE DOPANT INTO AMORPHOUS 2-D MATERIAL BY LOW ENERGY ION IMPLANTATION AT SUBSTRATE TEMPERATURE BELOW 550°C.
104

↓

PERFORM RAPID THERMAL ANNEALING OF DOPED AMORPHOUS 2-D MATERIAL, WHEREIN CRYSTALLINE DOPED 2-D CHANNEL LAYER FORMED
106

100

DEPOSIT FILM OF AMORPHOUS MoS$_2$ BY ATOMIC LAYER DEPOSITION, USING CARBON-CONTAINING PRECURSOR
202

↓

INTRODUCE DOPANT INTO MoS$_2$ FILM BY LOW ENERGY ION IMPLANTATION AT SUBSTRATE TEMPERATURE BELOW 550°C.
204

↓

PERFORM RAPID THERMAL ANNEALING OF AMORPHOUS DOPED MoS$_2$ AT TEMPERATURE BETWEEN 800°C AND 1000°C
206

200

(51) Int. Cl.
   *C23C 14/58* (2006.01)
   *H01L 29/76* (2006.01)
   *C23C 16/30* (2006.01)
   *C23C 16/455* (2006.01)
   *C23C 16/56* (2006.01)
   *C23C 14/48* (2006.01)
   *H01L 29/24* (2006.01)

(52) U.S. Cl.
   CPC ...... *C23C 16/305* (2013.01); *C23C 16/45553* (2013.01); *C23C 16/56* (2013.01); *H01L 21/0262* (2013.01); *H01L 21/02568* (2013.01); *H01L 21/02592* (2013.01); *H01L 21/02667* (2013.01); *H01L 29/24* (2013.01); *H01L 29/66969* (2013.01); *H01L 29/7606* (2013.01); *H01L 21/0257* (2013.01)

(58) Field of Classification Search
   CPC ............... H01L 12/122; H01L 12/1226; H01L 12/1223; H01L 12/124; H01L 12/1246; H01L 29/778; C23C 14/48; C23C 14/5806; C23C 16/45553; C23C 16/45525
   See application file for complete search history.

(56) References Cited

U.S. PATENT DOCUMENTS

| | | | | |
|---|---|---|---|---|
| 2016/0168694 | A1* | 6/2016 | Min | C23C 16/44 427/255.31 |
| 2017/0267527 | A1* | 9/2017 | Kim | C01B 19/002 |
| 2018/0127873 | A1* | 5/2018 | Sarnet | H01L 21/02568 |
| 2021/0074543 | A1* | 3/2021 | Kim | H01L 21/02667 |

OTHER PUBLICATIONS

Seokhee Shin, Zhenyu Jin, Do Hyun Kwon, Ranjith Bose, and Yo-Sep Min, High Turnover Frequency of Hydrogen Evolution Reaction on Amorphous MoS2 Thin Film Directly Grown by Atomic Layer Deposition, Langmuir 2015 31 (3), 1196-1202.*
Wu et al., "The Origin of High Activity of Amorphous 〖MoS〗_2 in the Hydrogen Evolution Reaction", ChemSusChem 2019, 12, 4336.*
Xu, Kang & Zhao, Yuda & Lin, Ziyuan & Wang, Longyan & Wang, Yi & Chan, Mansun & Chai, Yang. (2017). Doping of Two-Dimensional MoS2 by High Energy Ion Implantation. Semiconductor Science and Technology. 32. 10.1088/1361-6641/aa8ed3.*
Scholarly Community Encyclopedia, Two dimensional Material.*
Zeng, Yang & Zeng, Xiangbin & Wang, Shibo & Hu, Yishuo & Wang, Wenzhao & Yin, Sheng & Ren, Tingting & Zeng, Yirong & Lu, Jichang & Guo, Zhenyu & Xiao, Yonghong & Jin, Wen. (2019). Low-damaged p-type doping of MoS2 using direct nitrogen plasma modulated by toroidal-magnetic-field. Nanotechnology. 31. 10.1088/1361-6.*
Azcatl, Angelica & Qin, Xiaoye & Prakash, Abhijith & Zhang, Chenxi & Cheng, Lanxia & Wang, Qingxiao & Lu, Ning & Kim, Moon & Kim, Jiyoung & Cho, Kyeongjae & Addou, Rafik & Hinkle, Christopher & Appenzeller, Joerg & Wallace, Robert. (2016). Covalent Nitrogen Doping and Compressive Strain in MoS2 by Remote N2 Plasma.*
Ding R, Wang M, Wang X, Wang H, Wang L, Mu Y, Lv B. N-Doped amorphous MoSx for the hydrogen evolution reaction. Nanoscale. Jun. 21, 2019;11(23):11217-11226. doi: 10.1039/c9nr02717c. Epub Jun. 3, 2019. PMID: 31157804.*
Wang, Dezhi & Xie, Yingying & Wu, Zhuangzhi. (2019). Amorphous phosphorus-doped MoS2 catalyst for efficient hydrogen evolution reaction. Nanotechnology. 30. 10.1088/1361-6528/aafff2.*

* cited by examiner

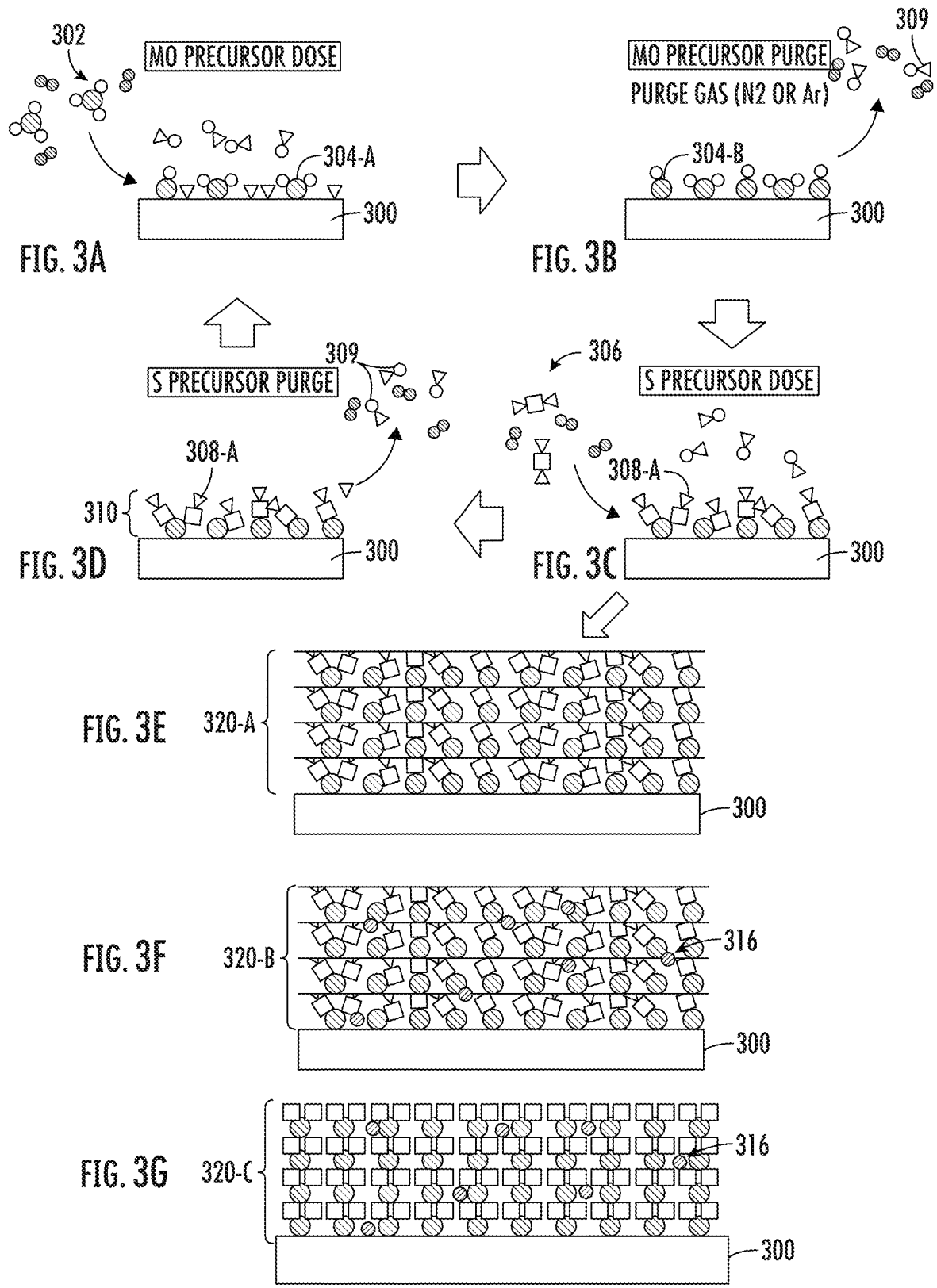

METHOD OF FORMING A 2-DIMENSIONAL CHANNEL MATERIAL, USING ION IMPLANTATION

RELATED APPLICATIONS

The present application claims priority to U.S. Provisional patent application No. 63/086,774, filed Oct. 2, 2020, entitled METHOD OF FORMING A 2-DIMENSIONAL CHANNEL MATERIAL USING ION IMPLANTATION, and incorporated by reference herein in its entirety.

FIELD OF THE DISCLOSURE

The present embodiments relate to processing for forming transistor devices, and more particularly for forming 2-dimensional channel structures.

BACKGROUND OF THE DISCLOSURE

Atomically thin-films of layered semiconductors that act as 2-dimensional materials (2-D materials) such as $MoS_2$, have received increasing attention as device applications. Such materials are attractive for device applications because of the ultrathin body nature, large bandgap, thermal stability and compatibility with semiconductor processing afforded by 2-D materials. Moreover, field effect transistors (FETs) built from several layers of $MoS_2$ may be immune to short channel effects.

One challenge is to form doped ultrathin 2-D layers in a controllable manner, including in memory devices such as DRAM and 3D NAND devices, where conformality may be useful. In order to control electrical properties (mobility, carrier concentration, $I_{on}/I_{off}$, $V_t$) of devices formed with 2-D materials used as channel materials, the control of channel layer growth as well as doping of the channel layer becomes more challenging as layer thickness decreases below 10 nm. Doping of $MoS_2$ or similar 2-dimensional materials, including other transition metal dichalcogenides (TMD), has been studied using ion implantation into crystalline layers. However, controlling the structure of such thin layers after implantation and associated processing remains a challenge.

It is with respect to these and other considerations, the present disclosure is provided.

BRIEF SUMMARY

In one embodiment, a method to form a 2-Dimensional transistor channel may include depositing an amorphous layer, comprising a 2-dimensional material; implanting an implant species into the amorphous layer; and annealing the amorphous layer after the implanting. As such, the amorphous layer may form a doped crystalline layer.

In another embodiment, a method to form a 2-Dimensional transistor channel is provided. The method may include depositing an amorphous layer, comprising a 2-dimensional material, performing a doping process to introduce a dopant into the amorphous layer, and annealing the amorphous layer after the performing the doping process, wherein the amorphous layer forms a doped crystalline layer.

In a further embodiment, a method of forming a memory device is provided. The method may include a substrate, the substrate having an amorphous $MoS_xC_y$ layer formed in a channel region, implanting an implanting species into the amorphous $MoS_xC_y$ layer, and annealing the amorphous $MoS_xC_y$ layer after the implanting, wherein the amorphous $MoS_xC_y$ layer forms a doped crystalline layer.

BRIEF DESCRIPTION OF THE DRAWINGS

The accompanying drawings illustrate exemplary approaches of the disclosed embodiments so far devised for the practical application of the principles thereof, and wherein:

FIGS. 3A-3G show various operations during formation of a doped 2-D channel layer, according to embodiments of the disclosure;

Figure 1:
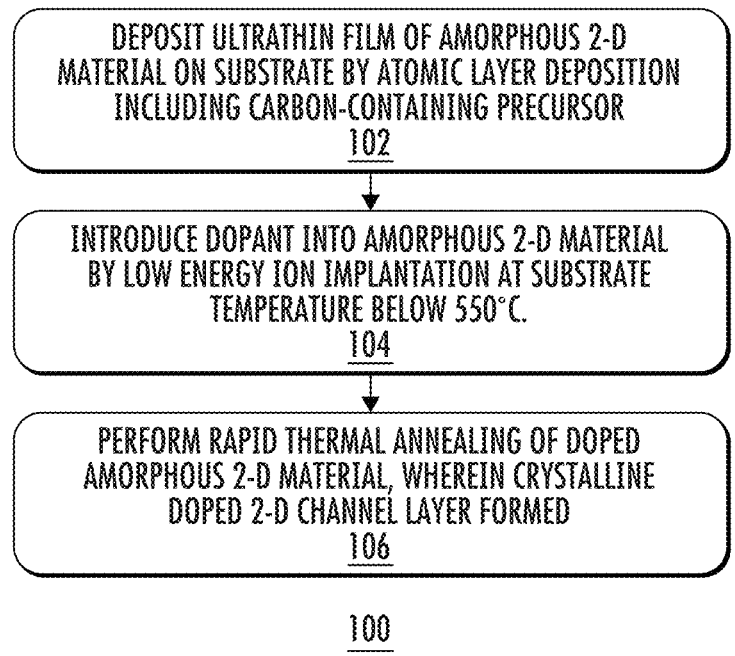
FIG. 1 shows an exemplary process flow, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods are disclosed in accordance with the present disclosure and with reference to the accompanying drawings, where embodiments are shown. The embodiments may be embodied in many different forms and are not to be construed as being limited to those set forth herein. Instead, these embodiments are provided so the disclosure will be thorough and complete, and will fully convey the scope of methods, systems, and devices to those skilled in the art.

In various embodiments, novel methods for forming transistor channels are disclosed. In various embodiments, 2-dimensional transistor channel methods may include deposition a 2-dimensional material as an amorphous layer, implanting an implant species into to amorphous layer, and annealing the amorphous layer, after the implanting to form a doped crystalline layer, formed of a 2-dimensional material. This sequence of operations avoids difficulties encountered with known approaches for doping thin crystalline channel layers, such as layers based upon 2-dimensional materials.

FIG. 1 presents an exemplary process flow 100, in accordance with embodiments of the disclosure. At block 102, an ultrathin layer of an amorphous 2-D material is deposited by atomic layer deposition (ALD) on a substrate, such as a transistor channel region. The ultrathin layer may have a thickness less than 20 nm, or less than 10 nm in various non-limiting embodiments. In particular embodiments, the ultrathin layer may have a thickness between 1.5 nm and 6 nm. The amorphous 2-D material may in particular include carbon. In various embodiments, the deposition temperature may be at or below 120° C.

At block 104, a dopant is introduced into the amorphous 2-D material by low energy ion implantation. The substrate temperature during ion implantation may be held to less than 550° C. during implantation, where the 2-D material remains amorphous during implantation. In some examples, the substrate may be unheated and may be near room temperature, while in other examples, the substrate may be cooled, such as to −100° C. At block 106, the amorphous, doped, 2-D material is heated by rapid thermal annealing to generate a crystalline doped 2-D channel layer. In some examples, the maximum temperature during RTA may be between 800° C. to 1000° C.

Figure 2:
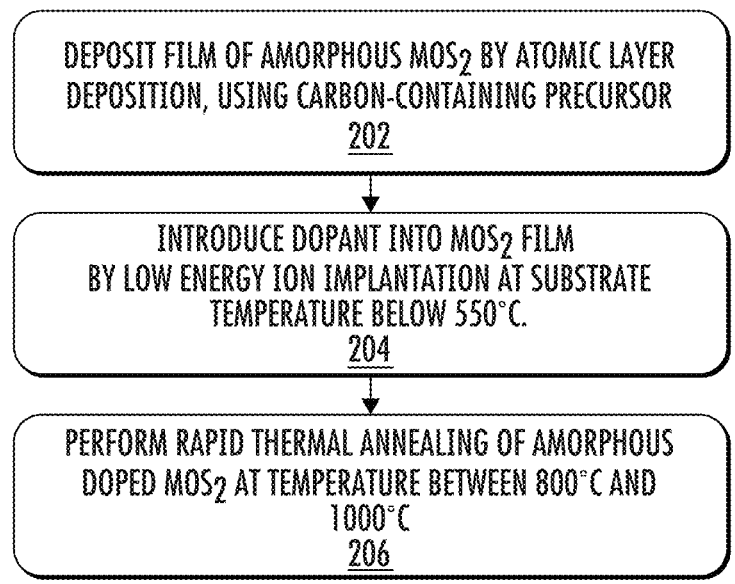
FIG. 2 shows another exemplary process flow, according to embodiments of the disclosure.

FIG. 2 presents an exemplary process flow 200, in accordance with other embodiments of the disclosure. At block 202, an film of amorphous $MoS_2$ is deposited by atomic layer deposition (ALD) on a substrate, where the film is formed using a carbon-containing precursor. The film may have a thickness less than 20 nm, or less than 10 nm in various non-limiting embodiments. In particular embodiments, the ultrathin layer may have a thickness between 1.5 nm and 6 nm.

In various non-limiting embodiments, suitable precursors include: tetrakis(dimethylamino)molybdenum, tetrakis(ethylmethylamino)molybdenum, molybdenum hexacarbonyl, tris(2,2,6,6-tetramethylheptane-3,5-dionato)molybdenum, bis(tert-butylimido)-bis(dimethylamido)molybdenum for depositing Mo. Suitable precursors for depositing S include 1,2-ethanedithiol, diethyl sulfide, diethyl disulfide, dimethyl disulfide.

At block 204, a dopant is introduced into the amorphous $MoS_2$ film by low energy ion implantation. The substrate temperature during ion implantation may be held to less than 550° C. during implantation, where the 2-D material remains amorphous during implantation. In some examples, the substrate may be unheated and may be near room temperature, while in other examples, the substrate may be cooled, such as to −100° C. At block 206, the amorphous, doped, $MoS_2$ film is heated by rapid thermal annealing to generate a crystalline doped $MoS_2$ film. In some examples, the maximum temperature during RTA may be between 800° C. to 1000° C.

FIGS. 3A-3F show various operations during formation of a doped 2-D channel layer, according to embodiments of the disclosure. In FIG. 3A there is shown an initial operation of an ALD process, where a first sub-monolayer 304-A is deposited from a vapor precursor 302, such as an Mo-containing precursor. In some examples, the ALD process may represent deposition of $MoS_2$ or other known transition metal dichalcogenide material. As in known ALD processing, a film or layer may be grown in a monolayer-by-monolayer sequence, where a given monolayer is formed by providing two or more different components as separately-deposited sub-monolayers. In the case of $MoS_2$, Mo may represent component A, while S represents component B. As such, the vapor precursor 302 in FIG. 3A may represent tetrakis(dimethylamino)molybdenum, tetrakis(ethylmethylamino)molybdenum, molybdenum hexacarbonyl, tris(2,2,6,6-tetramethylheptane-3,5-dionato)molybdenum, bis(tert-butylimido)-bis(dimethylamido)molybdenum in some non-limiting embodiments. The temperature of the substrate 300 may be held below 500° C., such that, in the as-deposited state, the first sub-monolayer 304-A retains precursor material including carbon, hydrogen, and so forth.

At FIG. 3B, a precursor purge operation is performed to remove material, such as ligands, leaving purged first sub-monolayer 304-B. Non-limiting examples of suitable purge gas include $N_2$ or Ar. Notably, some precursor material may remain, such as carbon.

At FIG. 3C, deposition of a second sub-monolayer 308-A takes place, using a vapor precursor 306, to introduce a component B. In some examples the vapor precursor 306 may be an organic sulfur-containing co reactant. In the example of deposition of $MoS_2$, the vapor precursor 306 may be 1,2-ethanedithiol, diethyl sulfide, diethyl disulfide, dimethyl disulfide according to different non-limiting embodiments. The temperature of the substrate 300 may be held below 500° C., such that, in the as-deposited state, the second sub-monolayer 308-A retains precursor material including carbon, hydrogen, and so forth.

At FIG. 3D, a second precursor purge operation is performed to remove material, such as ligands, leaving purged second sub-monolayer 308-B. Notably, some precursor material may remain, such as carbon. In the sequence of FIGS. 3A-3D, the result is the formation of a monolayer 310 in amorphous form, including precursor material such as carbon. While the monolayer 310 may be amorphous in structure, the present inventors have discovered that the monolayer 310 may nevertheless advantageously retain a stoichiometry at or near the stoichiometry of the intended crystalline phase.

In accordance with embodiments of the disclosure, after the sequence of operations of FIGS. 3A-3D, the operations proceed to those operations shown in FIG. 3F and FIG. 3G. Notably, depending upon the targeted thickness for the eventual 2-D layer to be formed, the sequence of FIGS. 3A-3D may be repeated, such as two times, four times, 10 times, 20 times, etc. before proceeding to FIG. 3F. FIG. 3E depicts one example of formation of a four-monolayer thick layer, where the amorphous layer 320-A is formed by cycling through the operations of FIGS. 3A-3D four times.

Following the example of FIG. 3E, at FIG. 3F dopants 316 are introduced into the amorphous layer 320-A to form a doped amorphous layer 320-B. In various non-limiting embodiments, the dopant 316 may be introduced by ion implantation. The dopants 316 may be implanted at an ion energy chosen according to the thickness of the amorphous layer 320-A, and generally below 10 keV, such as below 5 keV, below 1 keV, below 500 eV, below 200 eV, below 100 eV, below 50 eV, and so forth. For example, the ion energy may be chosen to prevent dopants 316 from being implanted into the substrate 300, thus avoiding substrate damage. Suitable species for implanting of dopants in a beamline ion implanter include: He, B, C, N, F, Ne, Al, Si, As, P, Ar, $N_2$, $As_2$, $P_2$, where implant temperature may be −100° C., 15° C., 150-550° C. in various non-limiting embodiments. A tilt angle from zero degrees up to 80 degrees C. may be used during beamline implantation with an ion dose of $1E12$ ions/cm$^2$ to $1E16$ ions/cm$^2$ in various non-limiting embodiments.

In some embodiments, such as for very low energy implantation, below 10 KeV, and in particular below several keV, to perform a doping process, a plasma type doping tool may be used at a bias below 10 kV, where suitable species include $PH_3$, $AsH_3$, $N_2$, He, $H_2$, $N_2$, Ar and mixtures thereof, suitable temperatures range from 15° C.-550° C., and suitable ion dose ranges from $1E14$ ions/cm$^2$ to $1E17$ ions/cm$^2$.

At FIG. 3G, the doped amorphous layer 320-B formed in the operation of FIG. 3F is annealed, such as by rapid thermal annealing. As such, a doped crystalline layer 320C is formed. In this operation, precursor material such as carbon may be driven off, and the non-crystalline nature of the layer transformed into a crystalline layer. Advantageously, using the ALD process as outline above, the crystalline layer may form in a preferred crystallographic orientation to form a 2-D sheet-like orientation parallel to the main plane of the substrate, useful for superior device electrical properties. Further advantageously, any defects in the layer introduced by ion implantation may be annealed out during the operation of FIG. 3G. Still further, because the amorphous layer 320A retains precursor material, the overall thickness of the amorphous layer 320A will be thicker than the final thickness of the layer 320C As such, for formation of very thin final channel layers, the implantation into the amorphous layer 320A provides the advantage of blocking ions from penetrating to the substrate 300 at a given implant energy or implant voltage, as compared to implantation into thinner crystalline layers.

Examples

Advantageously, the present inventors have discovered a combination of procedures where an ultrathin 2-D layer may be formed having a useful composition, microstructure, and crystallographic orientation, even when the material of the 2-D layer is deposited in an amorphous state. In various experiments, ALD processing has been performed for the Mo/S system, where the ratio of S/M was controlled to vary within the range of 1.9 to 2.0, while the C/Mo ratio was controlled to vary within the range of 0.9 to 1.1. Deposition thickness of the as-deposited amorphous layer was linearly controlled by controlling the number of ALD cycles, with a range of 1 nm-10 nm in one series of experiments.

After deposition, amorphous films were subjected to rapid thermal annealing in a temperature range of 800° C. to 1000° C., yielding a final film composition with an S/Mo ratio varying between 1.8-2.25, depending on anneal conditions. Note that the ideal ratio of S/Mo is equal to 2 for the stoichiometric disulfide phase. Additionally, X-ray photoelectron spectroscopy analysis did not detect any carbon (C) remaining in the films after annealing, meaning the carbon in the as-deposited amorphous films was driven from the film.

Figure 4A:
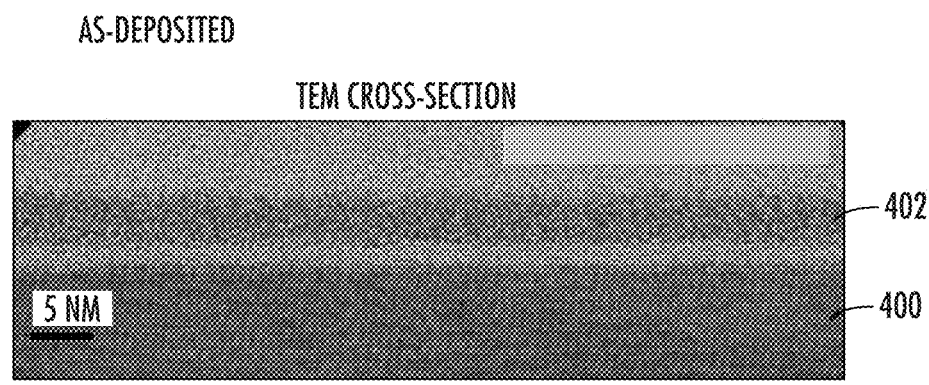
FIG. 4A is an electron micrograph of an amorphous 2-D channel layer, formed in accordance with embodiments of the disclosure.

To illustrate these features, FIG. 4A is an electron micrograph of an amorphous 2-D channel film, formed in accordance with embodiments of the disclosure. In this example, an amorphous layer 402 having the general composition of $MoS_xC_y$, was deposited on a substrate 400 by performing 20 deposition cycles of ALD process at 95° C. temperature. The amorphous layer was deposited on a monocrystalline silicon substrate having a native $SiO_2$ layer at the surface. The thickness of the as-deposited film is approximately 4 nm-5 nm, while the electron micrograph shows a microstructure that exhibits no crystallinity. This lack of crystallinity is confirmed in X-ray diffraction analysis, which spectra show a lack of crystalline peaks. Advantageously, at this stage of processing dopants may be introduced into the film, such as by low energy ion implantation.

Figure 4B:
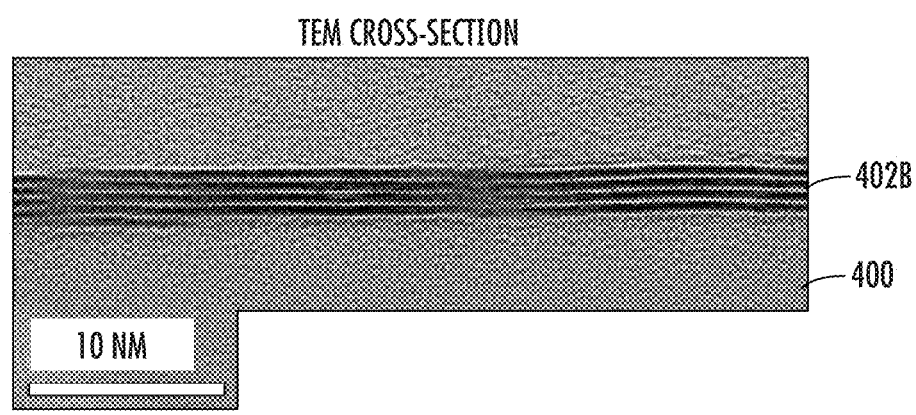
FIG. 4B is an electron micrograph of the 2-D channel layer of FIG. 4A, after an annealing operation, formed in accordance with embodiments of the disclosure.

FIG. 4B is an electron micrograph of the 2-D channel layer 402B, after rapid thermal annealing at 900° C. in an $N_2$ anneal ambient, according to embodiments of the disclosure. In this example, the 2-D channel film exhibits a series of well oriented layers, parallel to the main plane of the substrate, indicating that the layer has crystallized. The thickness of the 2-D channel layer is now in the range of 2.5 nm-3 nm. Accordingly, the results of FIGS. 4A-4B show that the final film thickness of the crystalline film is on the order of ~60% of the thickness of the initial thickness of the amorphous film.

Figure 5:
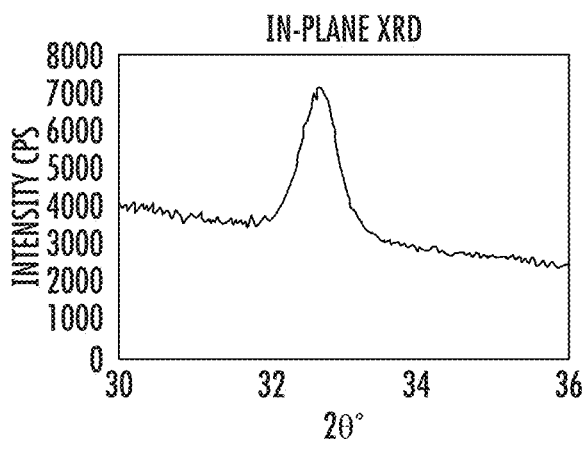
FIG. 5 and FIG. 6 present X-ray diffraction analysis and Raman spectroscopy of a crystalline 2-D channel layer formed according to embodiments of the disclosure.
Figure 6:
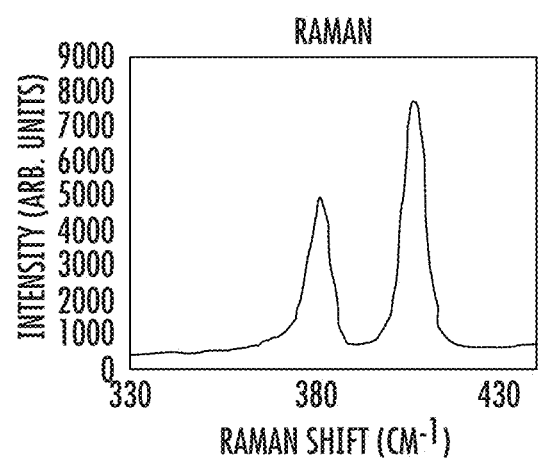

FIG. 5 and FIG. 6 present X-ray diffraction analysis and Raman spectroscopy of a crystalline 2-D channel layer formed according to embodiments of the disclosure, in a manner similar to the process conditions for forming the samples of FIGS. 4A and 4B. In FIG. 5, a single X-ray diffraction peak in the range of 33 degrees two theta is indicative of a high degree of preferred crystallographic orientation, corresponding to the (100) crystallographic plane of the $MoS_2$ phase. Similarly, the $A_{1g}$, $E^1_{2g}$ Raman peaks observed in the spectrum of FIG. 6 indicate a high degree of crystallinity.

Moreover, micrographic analysis has indicated that crystalline grain sizes (in plane) up to 20 nm or so have been achieved, indicating suitability for building devices having channel length on the order of tens of nanometers or less.

In additional examples, crystalline $MoS_2$ layers have been formed generally in accordance with the aforementioned procedures on a variety of amorphous and crystalline materials, including $SiO_2$, SiN, TiN, Si, $HfO_2$, $Al_2O_3$.

In view of the above results, a suitable approach for forming a superior doped 2-D channel materials may include first depositing a thin amorphous layer (film) in a cyclical process, such as ALD, and implanting the amorphous layer to a suitable concentration. For example, a dopant concentration of $1E17/cm^3$-$1E20$ $cm/cm^3$ may be achieved using a dose in the range of $1E12/cm^2$-$1E15/cm^2$ depending upon the exact layer thickness. This approach allows implantation to take place when the layer is relatively thicker, so that low energy ions may be more effectively screened from implanting into the substrate and causing damage. Additionally, the present approach does not entail extra processing procedures, since crystallinity of the channel layer may be achieved as a byproduct of an annealing process used to activate the implanted dopants.

Figure 7A:
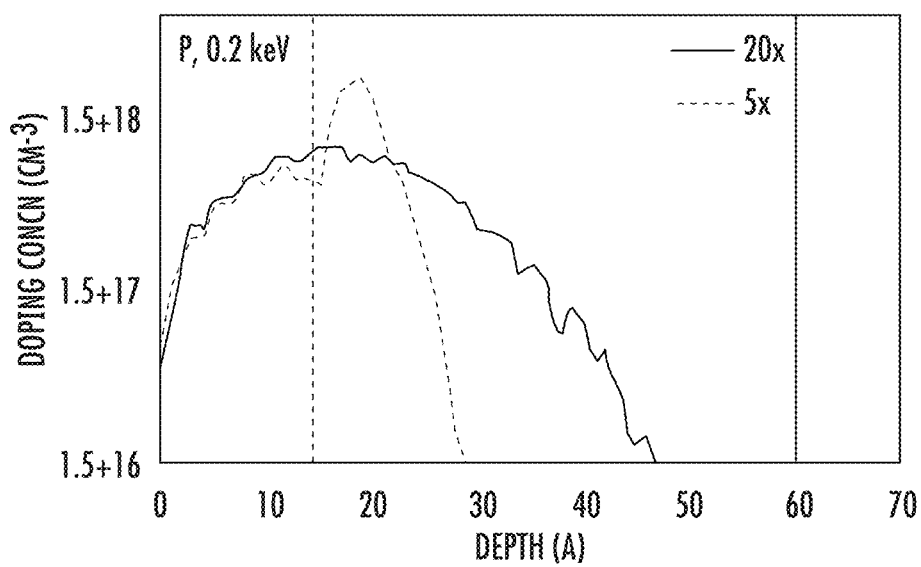
FIGS. 7A-7C show simulated implant profiles into amorphous $MoS_2$ for different implant species.
Figure 7B:
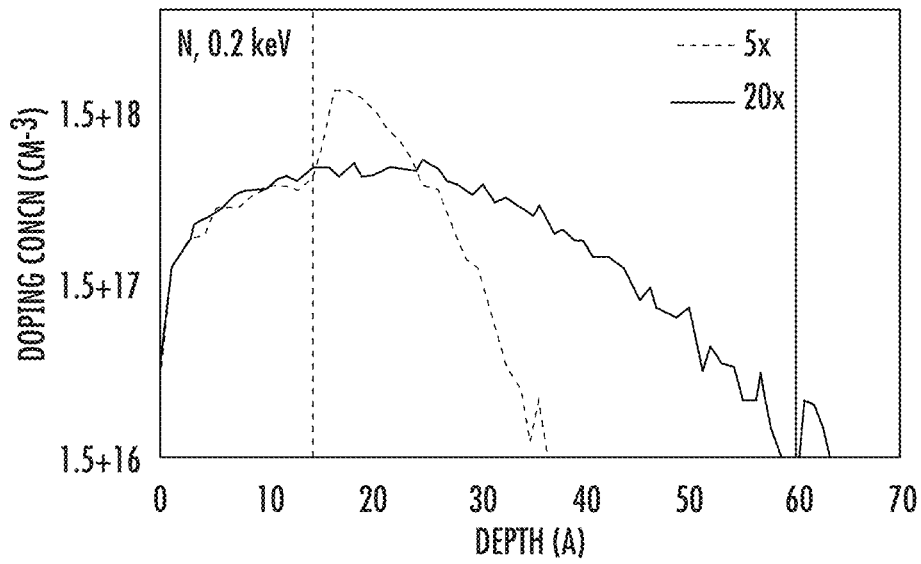
Figure 7C:
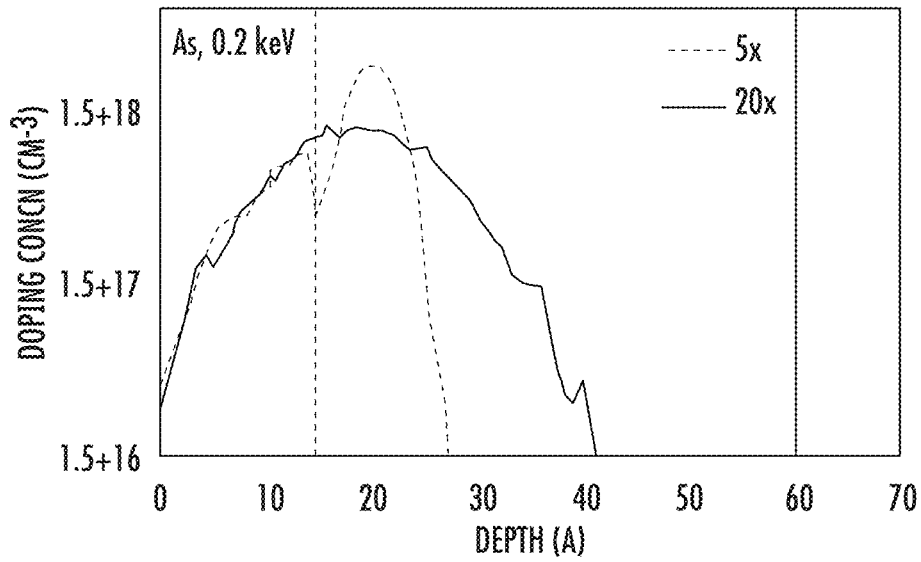

FIGS. 7A-7C show simulated implant profiles (using TRIM) into amorphous $MoS_2$ for different implant species. In the simulations shown a dose of $5E12$ $cm^{-2}$ ions is implanted at 200 eV ion energy into an amorphous $MoS_2$ layer on a $Al_2O_3$ substrate. In each figure, implantation into two different thicknesses of $MoS_2$ are simulated, one for one monolayer of $MoS_2$ generated by 5 ALD cycles (shallower curve), and the other for 4 monolayers of $MoS_2$ generated by 20 ALD cycles. In FIG. 7A, phosphorous is implanted, in FIG. 7B nitrogen is implanted, while in FIG. 7C As is implanted. As shown in FIG. 7A and FIG. 7C, the implant profile of phosphorous or arsenic extends beyond the interface between the $MoS_2$ layer and substrate (at 15 Å depth) for a single monolayer film, while the implant profile for a 4 monolayer film (60 Å thickness) is completely contained within the 4 monolayer film (substrate interface at 60 Å depth. Likewise, for nitrogen, the implant profile of nitrogen extends beyond the interface between the $MoS_2$ layer and substrate (at 15 Å depth) for a single monolayer film, while the implant profile for a 4 monolayer film (60 Å thickness) is nearly completely contained within the 4 monolayer film (substrate interface at 60 Å depth. Thus, these results suggest that 4 monolayer thick amorphous $MoS_2$ may be readily doped with a variety of implant species without incurring undue damage to an underlying substrate, while for a single monolayer $MoS_2$ implantation, ion energy as low as 100 eV or less may be more suitable for avoiding implantation into the underlying substrate. Alternatively, or in addition, an overlayer, such a sacrificial overlayer, may be deposited on an amorphous MoS$_2$ layer before ion implantation, to attenuate ions sufficiently to prevent penetration to the substrate, subjacent the MoS$_2$ layer.

In sum, the present embodiments provide novel techniques that enable formation of very thin doped 2-D channel materials.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present embodiments provide at least the following advantages. A first advantage is that doping of a channel layer may be accomplished while avoiding damage to a crystalline channel material, since implantation takes place before the crystalline channel material is formed. Another advantage is that extra processing operations may be avoided since a crystallization anneal employed to crystallize the implanted channel layer may be incorporated into existing annealing processes for activating dopants and repairing damage. Another advantage is that the use of an amorphous layer for dopant implantation provides a relatively thicker layer than the final doped crystalline channel layer, making implantation into the desired film easier, and also minimizing the number of ions implanted into the underlying substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method to form a 2-Dimensional transistor channel, comprising:
   depositing an amorphous layer on a substrate;
   implanting an implant species into the amorphous layer; and
   annealing the amorphous layer to form a doped crystalline layer.

2. The method of claim 1, the amorphous layer comprising a transition metal dichalcogenide.

3. The method of claim 1, the amorphous layer comprising MoS$_x$C$_y$.

4. The method of claim 3, the depositing comprising:
   providing a first precursor chosen from a group consisting of tetrakis(dimethylamino)molybdenum, tetrakis(ethylmethylamino)molybdenum, molybdenum hexacarbonyl, tris(2,2,6,6-tetramethylheptane-3,5-dionato)molybdenum, and bis(tert-butylimido)-bis(dimethylamido)molybdenum for depositing Mo; and
   providing a second precursor chosen from a group consisting of 1,2-ethanedithiol, diethyl sulfide, diethyl disulfide, and dimethyl disulfide for depositing S.

5. The method of claim 1, the depositing the amorphous layer comprising performing atomic layer deposition at a deposition temperature, at or below 120° C.

6. The method of claim 5, wherein the performing the atomic layer deposition comprises performing a plurality of deposition cycles to deposit at least one monolayer of material.

7. The method of claim 6, wherein one monolayer of material is deposited, the method further comprising depositing an overlayer on the amorphous layer before the implanting.

8. The method of claim 1, the implant species selected from a group consisting of He, B, C, N, F, Ne, Al, Si, As, P, Ar, N$_2$, As$_2$, P$_2$ and any combination thereof.

9. The method of claim 1, wherein the annealing comprises performing rapid thermal processing at a temperature of 800° C. to 1000° C., using an anneal ambient comprising N$_2$, Ar, H$_2$S, H$_2$Se or mixtures thereof.

10. The method of claim 1, wherein the implant species is implanted at an energy of 0.01-10 keV.

11. The method of claim 1, wherein the implant species is implanted at a substrate temperature of −100° C. to 550° C.

12. The method of claim 1, wherein the implant species is implanted at a tilt angle of zero degrees to 80 degrees.

13. The method of claim 1, wherein the implanting is performed by plasma doping using a dopant selected from a group consisting of PH$_3$, AsH$_3$, N$_2$, He, H$_2$, Ar and any mixtures thereof at an implant voltage of 0.01 kV-10 kV.

14. The method of claim 1, the implant species comprising an implant energy of 200 eV or below.

15. A method to form a 2-Dimensional transistor channel, comprising:
    depositing an amorphous layer;
    performing a doping process to introduce a dopant into the amorphous layer; and
    annealing the amorphous layer to form a doped crystalline layer.

16. The method of claim 15, wherein the amorphous layer is deposited on a substrate, and wherein the performing the doping process comprises implanting a dopant species into the amorphous layer, while not implanting the dopant species into the substrate.

17. The method of claim 15, the amorphous layer comprising a transition metal dichalcogenide.

18. The method of claim 15, the amorphous layer comprising $MoS_xC_y$.

19. The method of claim 15, the depositing the amorphous layer comprising performing atomic layer deposition at a deposition temperature, at or below 120° C., wherein the performing the atomic layer deposition comprises performing at least one deposition cycle to deposit at least one monolayer of material, and not more than 10 monolayers of material.

20. A method of forming a memory device, comprising:
providing a substrate, the substrate having an amorphous $MoS_xC_y$ layer formed in a channel region;
implanting an implant species into the amorphous $MoS_xC_y$ layer; and
annealing the amorphous $MoS_xC_y$ layer to form a doped $MoS_2$ crystalline layer.

\* \* \* \* \*